(12) United States Patent
Hwang

(10) Patent No.: US 6,924,070 B2
(45) Date of Patent: Aug. 2, 2005

(54) COMPOSITE PATTERNING INTEGRATION

(75) Inventor: David H. Hwang, Cupertino, CA (US)

(73) Assignee: Intel Corporation, Santa Clara, CA (US)

( * ) Notice: Subject to any disclaimer, the term of this patent is extended or adjusted under 35 U.S.C. 154(b) by 130 days.

(21) Appl. No.: 10/393,673

(22) Filed: Mar. 19, 2003

(65) Prior Publication Data

US 2004/0185350 A1 Sep. 23, 2004

(51) Int. Cl.$^7$ .............................. G03F 9/00; G03C 5/00
(52) U.S. Cl. .......................... 430/5; 430/290; 430/394; 430/322; 430/323; 430/324
(58) Field of Search .................... 430/5, 290, 322–324, 430/394

(56) References Cited

U.S. PATENT DOCUMENTS 6,656,644 B2 * 12/2003 Hasegawa et al. ............. 430/5

* cited by examiner

*Primary Examiner*—Geraldine Letscher
(74) *Attorney, Agent, or Firm*—Micheal Plimier

(57) ABSTRACT

Method and structure for masking are disclosed. In one embodiment, a thin layer of radiation sensitive material is combined with another layer of radiation opaque material with different etch selectivity to facilitate a multi-stage patterning treatment of an underlying mask layer and a resultant critical dimension in the patterned mask which may be less than that available using conventional patterning techniques.

28 Claims, 5 Drawing Sheets

US 6,924,070 B2

COMPOSITE PATTERNING INTEGRATION

BACKGROUND OF THE INVENTION

As requisite feature, or critical dimension ("CD"), sizes continue to decrease in microelectronic devices, masking continues to be a challenge. Research and development into patterning cameras and materials integrations consume significant resource to this end, with some cameras costing in the range of $20 million, and some resist materials costing in the range of $5,000 per quart.

Referring to FIGS. 1A–1F, a conventional patterning treatment is depicted. As shown in FIG. 1A, a mask layer (102) is positioned adjacent a substrate layer (100). Upon the mask layer (102), a resist layer (104) is formed to facilitate subsequent patterning of the mask layer (102). Referring to FIG. 1B, patterned irradiation (106) from a conventional camera is utilized to expose portions of the resist for selective removal and creation of trenches (110, 112, 114), as depicted in FIG. 1C. With a conventional resist material, the trenches (110, 112, 114) are formed using a solvent. The patterned resist layer (108) may then be utilized to guide the formation of trenches into the mask layer (102), as depicted in FIG. 1D. With a conventional mask layer (102) material such as chromium, a chlorine-based etch chemistry may be utilized to facilitate removal of desired chromium material. Such etch chemistries typically also are effective at removing resist material, and therefore a thinned patterned resist layer (116) results from such exposure. To prevent small defects or pinholes in the thinned patterned resist layer (116), the unmodified resist layer as depicted in FIG. 1A (104) typically is formed with extra thickness. For example, in a scenario where about 1,000 angstroms of chromium mask layer (102) are to be etched through, a resist layer having a thickness between about 3,000 and 4,000 angstroms may be sufficient at the outset to result in a final thinned patterned resist layer (130) thickness, as depicted in FIG. 1E, of about 1,500 angstroms—which may be thick enough to avoid unwanted defects and pinholes. Referring to FIG. 1F, the final thinned patterned resist layer (130) is subsequently removed to result in a final patterned mask layer (132).

It is known that the irradiation exposure intensity decays exponentially with depth into a targeted resist layer, such as that depicted in FIG. 1B under irradiation, and that this exponential decay in exposure intensity causes mask layer (102) CD to be approximately proportional to resist layer (104) thickness. Efforts to decrease CD, therefore, have resulted in significant work to develop resist materials, such as those mentioned above, which provide the requisite patterning functionality without pinholes or other inadequacies, such as uniformity degradation. The chemistry issues to this end are significant, and there is a need for other solutions to facilitate low-CD patterning.

BRIEF DESCRIPTION OF THE DRAWINGS

The present invention is illustrated by way of example and is not limited in the figures of the accompanying drawings, in which like references indicate similar elements. Features shown in the drawings are not intended to be drawn to scale, nor are they intended to be shown in precise positional relationship.

DETAILED DESCRIPTION

In the following detailed description of embodiments of the invention, reference is made to the accompanying drawings in which like references indicate similar elements. The illustrative embodiments described herein are disclosed in sufficient detail to enable those skilled in the art to practice the invention. The following detailed description is therefore not to be taken in a limiting sense, and the scope of the invention is defined only by the appended claims.

Figure 1A:
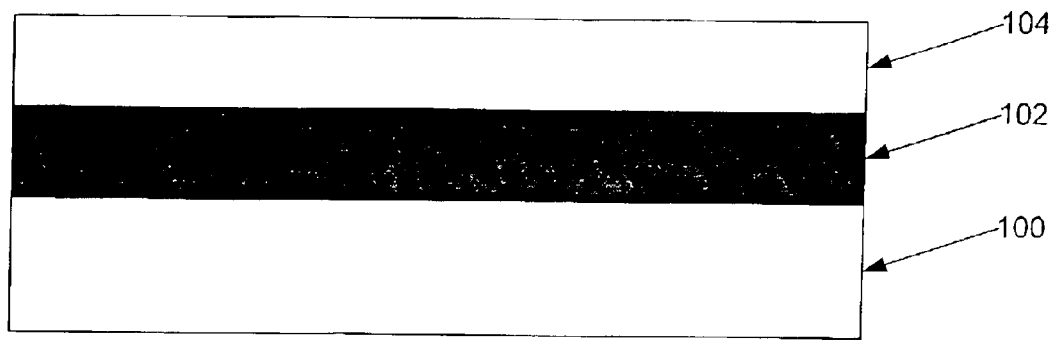
FIGS. 1A–1F depict cross-sectional views of a conventional mask patterning technique.
Figure 1B:
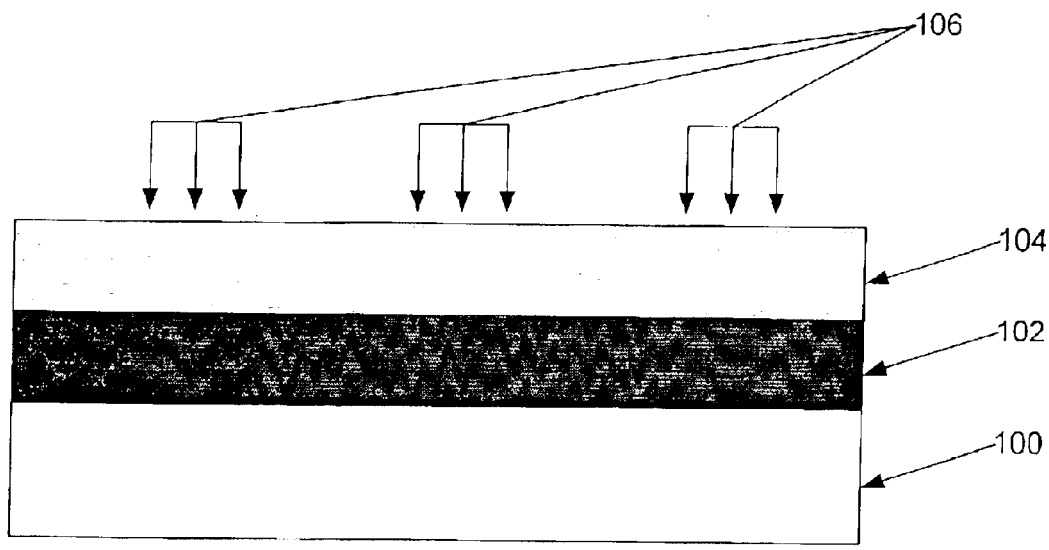
Figure 1C:
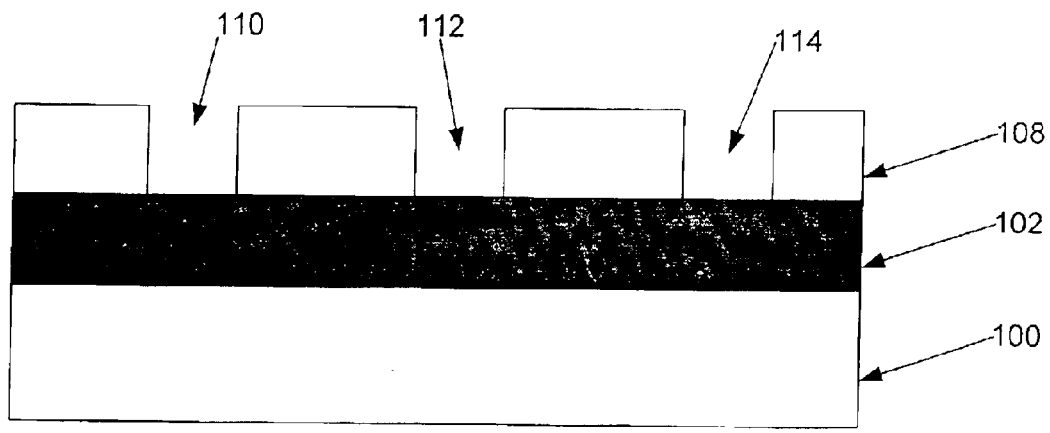
Figure 1D:
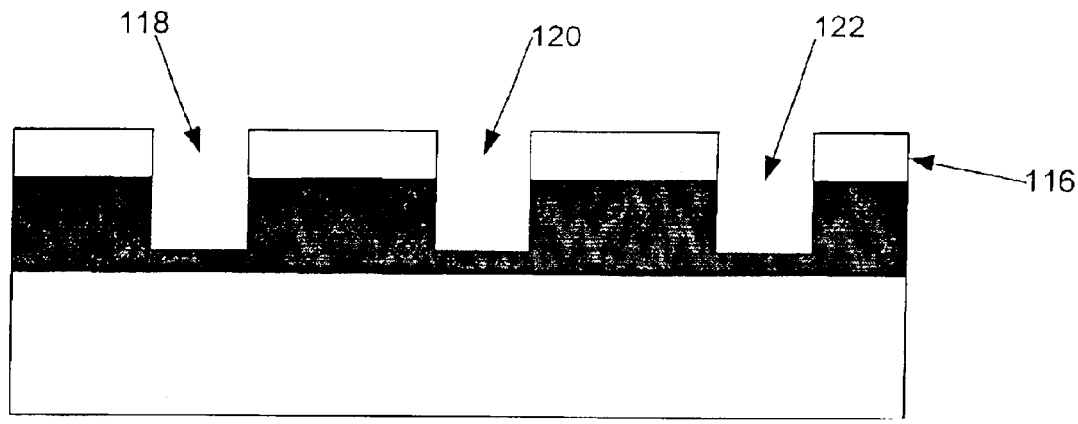
Figure 1E:
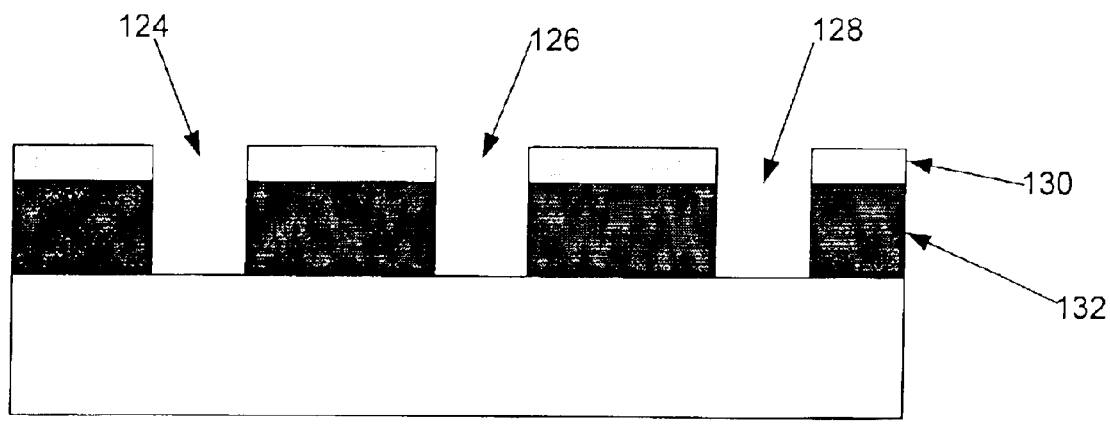
Figure 1F:
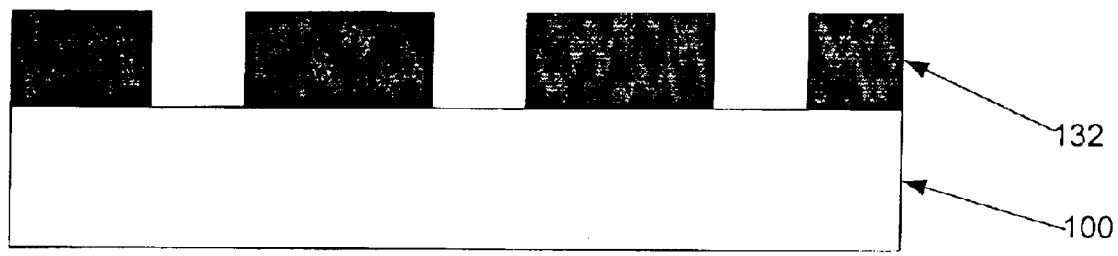
Figure 2A:
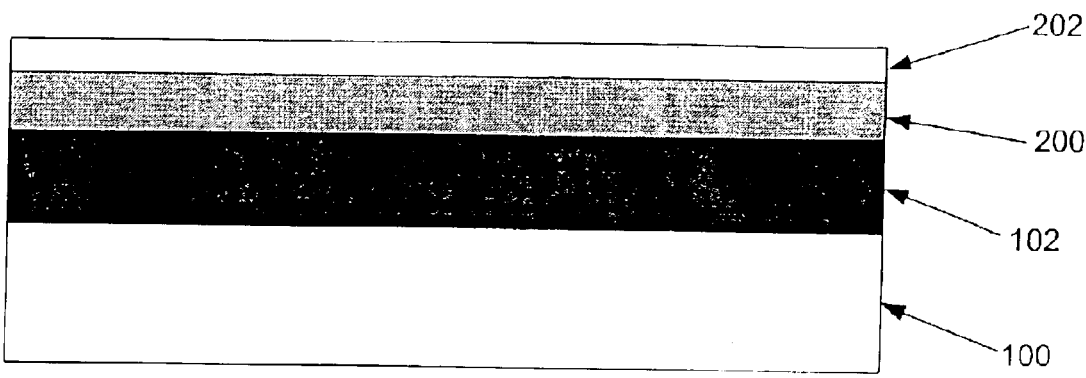
FIGS. 2A–2G depict cross-sectional views of various aspects of one embodiment of the present invention.

Referring to FIG. 2A, a structure somewhat similar to that of FIG. 1A is depicted, the structure of FIG. 2A having two patterning layers (200, 202) positioned above the substrate (100) and mask (102) layers, which are positioned adjacent each other. As is described in further detail below, the integration of a relatively thin second patterning layer (202) and a dry-etchable first patterning layer (200) with specific etch chemistry requirements in relation to the materials selected for the underlying mask layer (102) facilitates a relatively low CD patterning of the second patterning layer (202) as related to the thin-ness of this layer, and subsequent transfer of such low CD patterning into the first patterning layer (200) and mask layer (102).

The substrate layer (100) may comprise almost any substrate to be masked, including but not limited to materials such as quartz, tantalum nitride, molybdenum silicide, and silicon, which are conventionally utilized in semiconductor processing. The mask layer (102) may also comprise a broad panoply of materials selected for their radiation-opaque qualities, depending upon the radiation to be utilized in the final masking, as would be apparent to one skilled in the art. Particularly preferred are mask layer (102) materials such as chromium and tantalum nitride which may be etched with dry etch chemistries not substantially selective to the preferred materials for the first patterning layer (200), as described below. The mask layer (102) may be formed adjacent the substrate layer (100) utilizing conventional techniques, such as sputtering, chemical vapor deposition (CVD), or physical vapor deposition (PVD), with a thickness preferably between about 500 and about 1,000 angstroms.

The first patterning layer (200) preferably comprises silicon dioxide, silicon nitride, silicon oxynitride, silicon, or other materials conventionally utilized in hard mask applications to isolate underlying layers from treatments to layers above, such as wet etching. Most preferred are first patterning layer (200) materials which may be effectively dry etched using etch chemistries not particularly selective to the underlying mask layer (102) materials. For example, in the case of a chromium mask layer (102) and a silicon dioxide first patterning layer (200), a fluorine dry etch chemistry may be utilized to trench through the silicon dioxide without particular selectivity to the chromium, while the chromium may be subsequently trenched using a chlorine etch chemistry not particularly selective to the silicon dioxide. The first patterning layer (200) preferably is formed using conventional techniques such as sputtering, CVD, or PVD into a layer with a preferred thickness depending upon the subsequent etching treatment for trenching through the underlying mask layer (102). In one embodiment, for example, it is preferred to have a first patterning layer (200) thickness about as thick as the mask layer (102) thickness multiplied by the ratio of the first patterning layer (200) etch rate in the mask layer (102) etch chemistry to the mask layer (102) etch rate in the mask layer (102) etch chemistry, or the "etch ratio" of these two materials in the given etch chemistry. In such an embodiment wherein a chromium mask layer (102)

having a thickness of about 1,000 angstroms is to be etched with an etch chemistry three times faster through the chromium than through the first patterning layer (200) material, then the first patterning layer (200) preferably is about 1/3 the thickness of the chromium mask layer (102), or about 300 angstroms thick. With such a scenario, the relative thickness of the mask layer (102) and first patterning layer (200) are substantially proportional to their etch rates in the applied etch chemistry. In other words, the etch ratio of first patterning layer (200) material relative to mask layer (102) material may be utilized for optimizing the relative geometries of such layers to ensure that the remainder of the first patterning layer (200) is of a thickness sufficient to substantially isolate underlying structures from the etch chemistry. Etch ratio based layer geometry optimization is conventionally utilized with layers positioned to have "hard mask" functionality, wherein one of the purposes of their placement is protection of underlying material during etching and other treatments.

Referring again to FIG. 2A, the second patterning layer (202) is formed adjacent the first patterning layer (200). The second patterning layer (202) preferably comprises a radiation-sensitive material, such as a resist, which may be formed at a thickness of about 2,000 angstroms using spin coating techniques. Preferred resist materials, such as those based upon the poly(norbornene) polymer backbone, are available from suppliers such as Sumitomo Corporation, Fuji Film Corporation, Tokyo Ohka Company, and Shipley Corporation. Such materials may be formed into thin layers using conventional techniques such as spin coating. As discussed above, the thickness of the second patterning layer (202) is proportional to the theoretical CD which may be subsequently transferred into the underlying mask layer (102)—therefore the thickness of the second patterning layer (202) is desirably minimized. Depending upon the materials selected for the second patterning layer (202), thicknesses less than about 1,500 angstroms may be prone to pinholes or other nonuniformity problems.

Figure 2B:
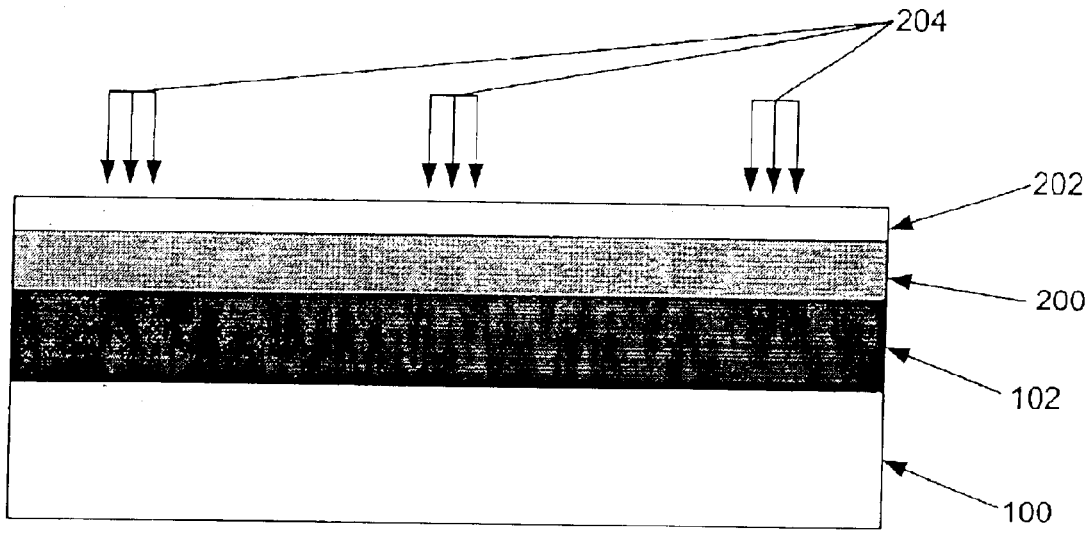
Figure 2C:
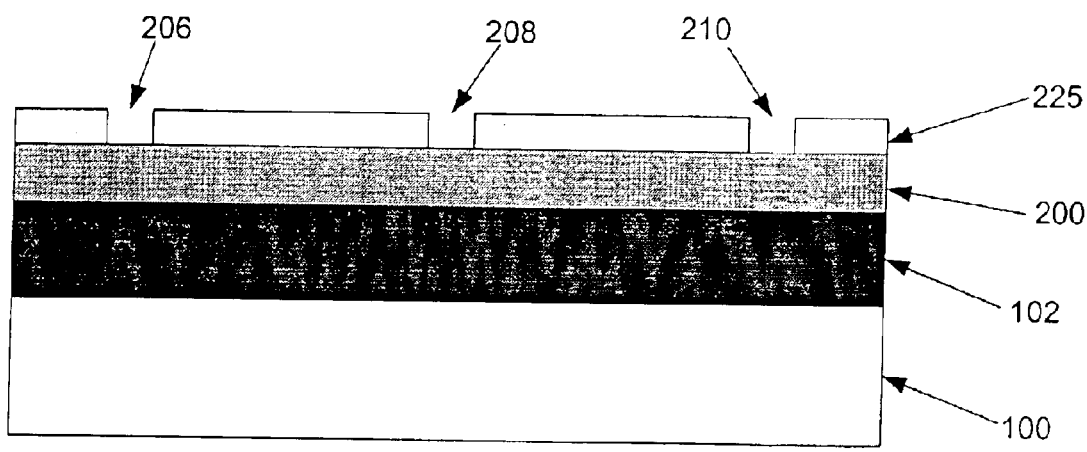

Referring to FIG. 2B, subsequent to formation of the mask layer (102), first patterning layer (200), and second patterning layer (202) upon the substrate layer (100), the second patterning layer (202) may be exposed to patterned irradiation (204) to form selectively removable regions of the second patterning layer (202) which may be removed to form trenches (206, 208, 210) using conventional techniques such as wet etching with a solvent, the preferred solvent varying with the material selected for the second patterning layer (202), as would be apparent to one skilled in the art. Preferably the removal technique or chemistry is selected to have little or no substantial effect upon the underlying first patterning layer (200). For example, referring to FIG. 2C, in an embodiment wherein wet etching with a resist solvent is utilized to facilitate formation of the trenches (206, 208, 210), the trenches preferably do not extend into the underlying first patterning layer (200) as a result of the solvent exposure to exposed portions of the first patterning layer (200). Solvent chemistries for resist materials are available from commercial suppliers such as Tokyo Ohka Company and Shipley Corporation. For example, resist solvents such as those sold under the tradenames SVC-150™ and MP 1165™ by Shipley Corporation may be utilized, depending upon the resist material. Subsequent to conventional resist stripping using such materials, trenches (206, 208, 210) are formed through the second patterning layer, resulting in a patterned second patterning layer (225) partially exposing the first patterning layer (200), as depicted in FIG. 2C.

Figure 2D:
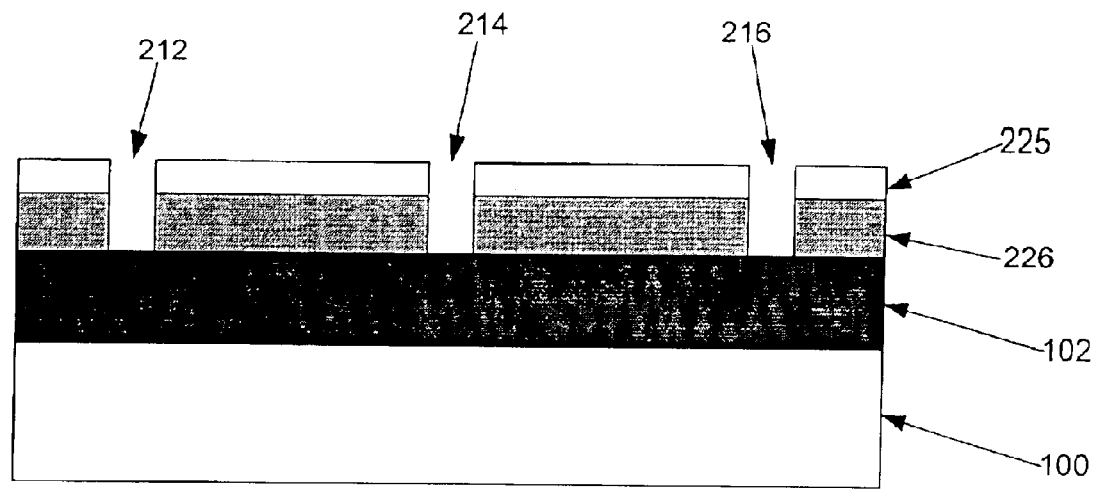
Figure 2E:
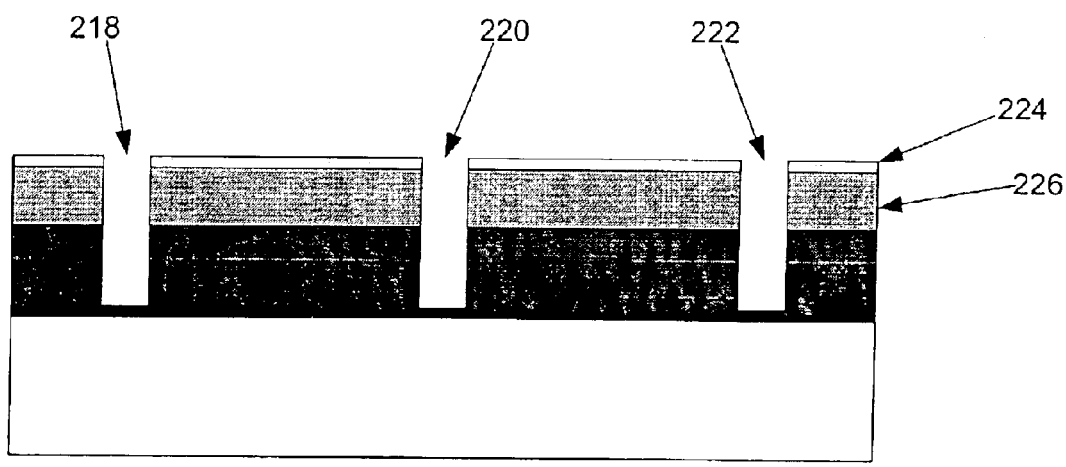

Referring to FIG. 2D, enlarged or extended trenches (212, 214, 216) are depicted, preferably resulting from the introduction of a first dry etch chemistry substantially more selective to the first patterning layer (200) material than to the underlying mask layer (102) material. For example, in one embodiment, the mask layer (102) comprises chromium, the first patterning layer (200) comprises silicon dioxide, and a fluorine dry etch chemistry may be utilized to form a patterned first patterning layer (226) by selectively dry etching the first patterning layer (200) without substantial alteration of the underlying chromium mask layer (102). Referring to FIG. 2D, trenches (212, 214, 216) are extended through the first patterning layer (200) to partially expose the underlying mask layer (102). The use of dry etch chemistries such as fluorine or chlorine based etch chemistries, along with carrier plasmas such as oxygen or hydrogen rich plasmas, to selectively, and preferably anisotropically remove material is well known in semiconductor processing. With the aforementioned embodiment, further extended trenches (218, 220, 220) may be formed into the chromium mask layer (102) by introducing a chlorine dry etch chemistry, resulting in a structure similar to that depicted in cross section in FIG. 2E. As shown in FIG. 2E, although the etch chemistry directed at selectively removing mask layer material preferably is not substantially selective to the material comprising the patterned first patterning layer (226), such etch chemistry may be selective to, or effective upon, exposed portions of the second patterning layer, resulting in a thinned second patterning layer (224), as depicted in FIG. 2E. Preferably, materials and etch chemistries are matched so the second etch chemistry utilized to selectively remove mask layer material is substantially more selective to the mask layer (102) material than to the material comprising the first patterning layer (200), as in the case of an embodiment wherein a fluorine etch chemistry is utilized to etch through a chromium mask layer (102) in proximity to a first patterning layer comprising a material such as silicon dioxide, silicon nitride, silicon oxynitride, or silicon, as discussed above in reference to the first patterning layer (200). Further, since the etch chemistry utilized to form trenches (212, 214, 216) through the first patterning layer up to the masking layer (102), as depicted in FIG. 2D, preferably is selective to the material comprising the first patterning layer (200) and substantially less selective to the material comprising the mask layer (102), a scenario of mutual selectivity and de-selectivity is preferred—such as in the embodiment described above wherein a chlorine etch chemistry is utilized to extend trenches through a first patterning layer (200) comprising a material such as silicon dioxide, silicon nitride, silicon oxynitride, or silicon, and a fluorine etch chemistry is utilized to continue extending the trenches through a mask layer (102) comprising a material such as chromium.

Figure 2F:
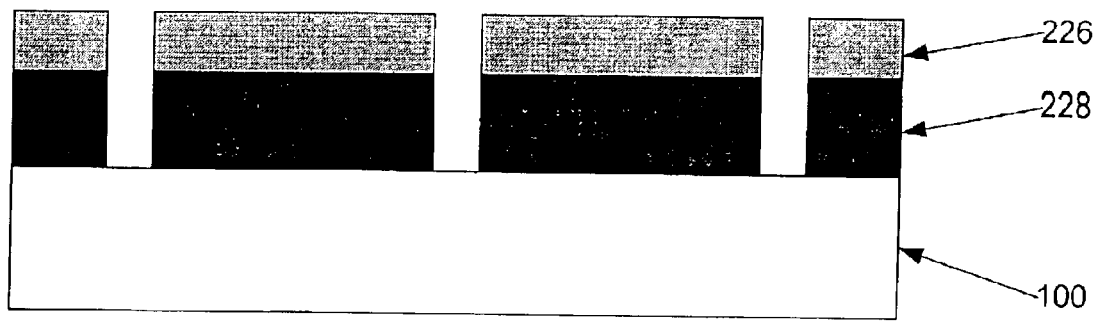
Figure 2G:
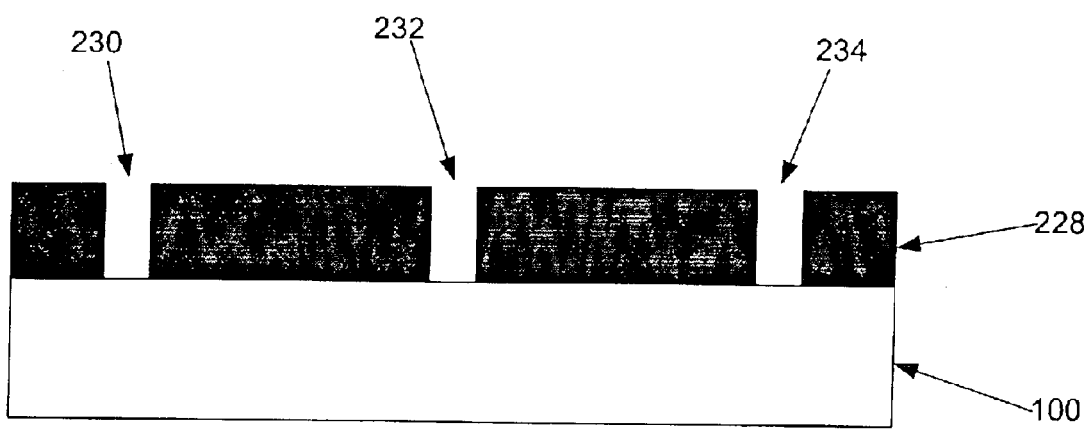

Referring to FIG. 2F, subsequent to completion of further trench extension by etching through the mask layer to form a patterned mask layer (228), and subsequent to removal of any remaining portions of the second patterning layer (not shown in FIG. 2F), a structure such as that depicted in FIG. 2F results. Finally, subsequent to removal of remaining portions of the patterned first patterning layer (226) with conventional techniques such as selective wet etching, the chemistry thereof being appropriately matched to the chemistry of the first patterning layer (226) and patterned mask layer (228) as would be apparent to one skilled in the art, a completed low-CD mask structure such as that depicted in FIG. 2G may result.

Thus, a novel patterning solution is disclosed. Although the invention is described herein with reference to specific embodiments, many modifications therein will readily occur to those of ordinary skill in the art. Accordingly, all such variations and modifications are included within the intended scope of the invention as defined by the following claims.

What is claimed is:

1. A method to form a mask comprising:
   a. forming a first patterning layer adjacent a mask layer;
   b. forming a second patterning layer adjacent the first patterning layer;
   c. exposing the second patterning layer to patterned irradiation to form selectively removable regions;
   d. forming trenches through the second patterning layer at the selectively removable regions to expose the first patterning layer;
   e. extending the trenches through the first patterning layer to expose the mask layer;
   f. extending the trenches through the mask layer.

2. The method of claim 1 wherein the first patterning layer comprises a material selected from the group consisting of silicon dioxide, silicon nitride, silicon oxynitride, and silicon.

3. The method of claim 1 wherein extending the trenches through the mask layer comprises introducing an etch chemistry selective to the mask layer relative to the first patterning layer, and wherein forming a first patterning layer comprises forming a layer of first patterning layer material with a thickness sufficient to substantially isolate underlying structures from the etch chemistry.

4. The method of claim 3 wherein forming the first patterning layer comprises forming the first patterning layer with a thickness, the thickness being at least equal to a thickness of the mask layer multiplied by an etch ratio, the etch ratio being the etch rate of the first patterning layer in the etch chemistry divided by the etch rate of the mask layer in the etch chemistry.

5. The method of claim 4 wherein the etch ratio is about 1/3 for the etch chemistry, and wherein forming a first patterning layer comprises forming a layer of first patterning layer material having a thickness about 3 times that of the adjacent mask layer.

6. The method of claim 1 wherein the second patterning layer comprises a radiation-sensitive resist material.

7. The method of claim 6 wherein forming a second patterning layer comprises depositing radiation-sensitive resist material at a thickness less than about 2,000 angstroms.

8. The method of claim 6 wherein forming trenches comprises wet etching with a resist solvent.

9. The method of claim 8 wherein wet etching with a resist solvent has no substantial effect upon the material comprising the underlying first patterning layer.

10. The method of claim 1 wherein extending the trenches through the first patterning layer comprises dry etching with a first etch chemistry substantially more selective to the material comprising the first patterning layer than to the material comprising the mask layer.

11. The method of claim 1 wherein extending the trenches through the mask layer comprises dry etching with a second etch chemistry substantially more selective to the material comprising the mask layer than to the material comprising the first patterning layer.

12. The method of claim 10 wherein the first etch chemistry is a fluorine etch chemistry.

13. The method of claim 11 wherein the second etch chemistry is a chlorine etch chemistry.

14. The method of claim 5 wherein the mask layer has a thickness of about 1,000 angstroms, and wherein forming a first patterning layer comprises forming a layer of first patterning layer material having a thickness of about 300 angstroms.

15. A mask structure comprising:
   a. a substrate layer;
   b. a mask layer positioned adjacent the substrate layer;
   c. a first patterning layer positioned adjacent the mask layer;
   d. a second patterning layer positioned adjacent the first patterning layer;
   wherein a first etch chemistry selective to the first patterning layer is substantially less selective to the mask layer; and
   wherein a second etch chemistry selective to the mask layer is substantially less selective to the first patterning layer.

16. The mask structure of claim 15 wherein the substrate layer comprises a material selected from the group consisting of quartz, tantalum nitride, molybdenum silicide, and silicon.

17. The mask structure of claim 15 wherein the mask layer comprises a material selected from the group consisting of chromium and tantalum nitride.

18. The mask structure of claim 15 wherein the first patterning layer comprises a material selected from the group consisting of silicon dioxide, silicon nitride, silicon oxynitride, and silicon.

19. The mask structure of claim 15 wherein the second patterning layer comprises a radiation-sensitive resist material.

20. The mask structure of claim 19 wherein the second patterning layer is less than about 2,000 angstroms in thickness.

21. The mask structure of claim 15 wherein the first etch chemistry is a fluorine etch chemistry, and the second etch chemistry is a chlorine etch chemistry.

22. The mask structure of claim 15 wherein the relative thicknesses of the mask layer and first patterning layer are approximately proportional to their etch rates in the second etch chemistry.

23. The mask structure of claim 22 wherein the second etch chemistry etches the mask layer about three times faster than it etches the first patterning layer, and wherein the thickness of the first patterning layer is about 1/3 the thickness of the mask layer.

24. The mask structure of claim 23 wherein the mask layer is about 1,000 angstroms thick and the first patterning layer is about 300 angstroms thick.

25. The mask structure of claim 24 wherein the mask layer comprises chromium and the first patterning layer comprises silicon.

26. The method of claim 1 further comprising removing substantially all of the second patterning layer and removing substantially all of the first patterning layer.

27. The method of claim 26 wherein removing substantially all of the second patterning layer and removing substantially all of the first patterning layer occurs after extending the trenches through the mask layer.

28. The method of claim 3 wherein forming the first patterning layer comprises forming the first patterning layer with a thickness, the thickness being about equal to a thickness of the mask layer multiplied by an etch ratio, the etch ratio being the etch rate of the first patterning layer in the etch chemistry divided by the etch rate of the mask layer in the etch chemistry.

* * * * *